US008283715B2

(12) United States Patent
Lin et al.

(10) Patent No.: US 8,283,715 B2
(45) Date of Patent: Oct. 9, 2012

(54) METHOD AND APPARATUS FOR BURIED WORD LINE FORMATION

(75) Inventors: Yung-Chang Lin, Taichung County (TW); Sheng-Chang Liang, Miao Li County (TW)

(73) Assignee: Rexchip Electronics Corporation, Taichung County (TW)

( * ) Notice: Subject to any disclaimer, the term of this patent is extended or adjusted under 35 U.S.C. 154(b) by 302 days.

(21) Appl. No.: 12/855,436

(22) Filed: Aug. 12, 2010

(65) Prior Publication Data
US 2012/0039104 A1 Feb. 16, 2012

(51) Int. Cl.
*H01L 27/108* (2006.01)
*H01L 29/94* (2006.01)
(52) U.S. Cl. ........ 257/302; 257/296; 257/330; 257/331; 257/334; 257/322; 257/E29.262; 257/E29.265; 438/242; 438/243; 438/259; 438/270; 438/272
(58) Field of Classification Search .................. 257/302, 257/296, 330, 334, 322, 331, E29.262, E29.265; 438/242, 243, 259, 270, 272
See application file for complete search history.

(56) References Cited

U.S. PATENT DOCUMENTS

| 6,297,531 | B2* | 10/2001 | Armacost et al. | 257/329 |
| 6,635,921 | B2* | 10/2003 | Yi et al. | 257/316 |
| 6,875,669 | B2* | 4/2005 | Wang et al. | 438/424 |
| 7,074,670 | B2* | 7/2006 | Park et al. | 438/253 |
| 7,160,780 | B2* | 1/2007 | Lee et al. | 438/283 |
| 7,518,182 | B2* | 4/2009 | Abbott et al. | 257/329 |
| 7,964,914 | B2* | 6/2011 | Jung | 257/331 |
| 8,120,085 | B2* | 2/2012 | Sugioka | 257/302 |
| 8,183,112 | B2* | 5/2012 | Lee et al. | 438/270 |
| 8,188,517 | B2* | 5/2012 | Choi | 257/211 |

* cited by examiner

*Primary Examiner* — Viet Q Nguyen
(74) *Attorney, Agent, or Firm* — Muncy, Geissler, Olds & Lowe, PLLC (57) ABSTRACT

An integrated circuit with a memory cell is disclosed. The integrated circuit with a memory cell includes: a word line disposed in a word line trench of a substrate; a bit line disposed below the word line in a bit line trench and extending orthogonal to the word line; and, a separating layer disposed above the bit line in the bit line trench that separates the word line from the bit line; wherein an etching rate of the separating layer approaches that of the substrate.

29 Claims, 14 Drawing Sheets

METHOD AND APPARATUS FOR BURIED WORD LINE FORMATION

BACKGROUND OF THE INVENTION

1. Field of the Invention

The invention relates to the fabrication of semiconductor integrated circuit structures, and more particularly to the formation of buried word line structures in memory cells.

2. Description of the Related Art

Semiconductor memories store bits of information in arrays of memory cells. For example, a dynamic random access memory (DRAM) cell typically includes an access field effect transistor (FET) and a storage capacitor. Memory cell word and bit lines may be buried by forming trenches in a semiconductor substrate and filling the trench with metal. Storage capacitors can be formed on the substrate surface or in the metal layers disposed above the substrate. For example, some types of DRAM cells have buried split word lines formed above buried bit lines. Some types of memory cells have buried word and bit lines.

Figure 1A:
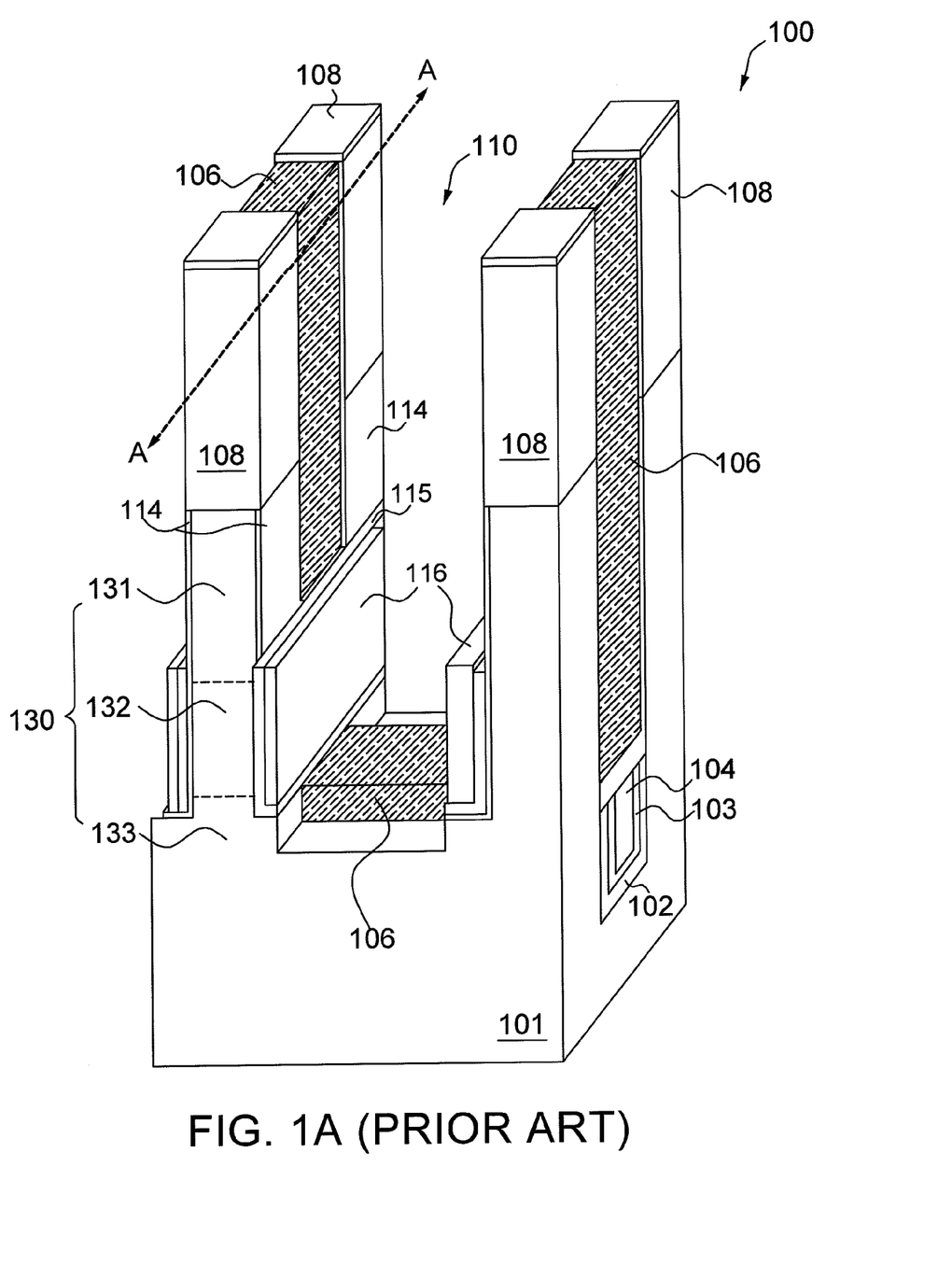
FIG. 1A is a perspective view of a conventional memory cell including buried word and bit lines.
Figure 1B:
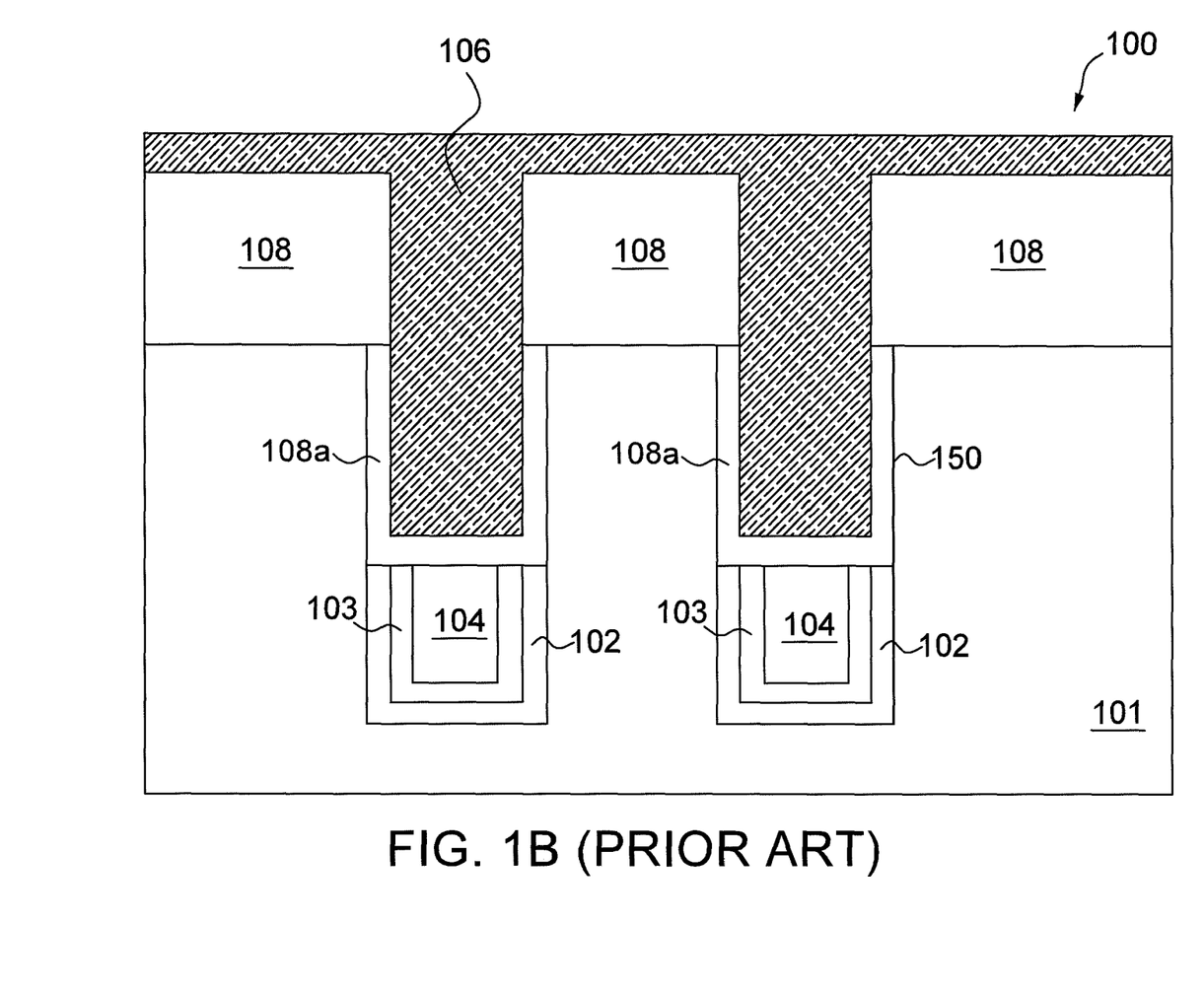
FIG. 1B is a cross-section view taken along the cut line A-A of FIG. 1A before buried word line trenches are formed.

FIG. 1A is a perspective view of a conventional memory cell including buried word and bit lines. FIG. 1B is a cross-section view taken along the cut line A-A of FIG. 1A before buried word line trenches are formed. Referring to FIG. 1B, a silicon substrate 101 is initially covered with a nitride layer 108, such as silicon nitride ($Si_3N_4$) and the substrate 101 is etched off to a preset depth, which forms the bit line trenches 150. An oxide (silicon dioxide, $SiO_2$) liner 102 is formed on the bottom and a portion of sidewalls of the bit line trenches 150 and a glue layer 103 is then formed over the oxide liner 102. Next, a metal is deposited over the glue layer 103 to form the bit lines 104 and nitride liner 108a is formed over the top of the metal 104 and a portion of sidewalls of the buried bit line trenches 150. Finally, the resulting spaces are filled with oxide 106.

Referring to FIG. 1A, a memory cell 100 includes buried bit and word lines 104, 116 coupled to a vertical access transistor 130 disposed in a semiconductor substrate 101. Vertically access transistors 130 are formed in semiconductor pillars that extend outwardly from an underlying substrate 101. Each of the vertically access transistors 130 include a first source/drain region 131, a channel region 132 and a second source/drain region 133. Nitride 108 is formed on the first source/drain region 131. The buried word lines 116 are arranged above the buried bit line 104 and extend in a trench 110 orthogonal to a buried bit line 104.

Figure 1C:
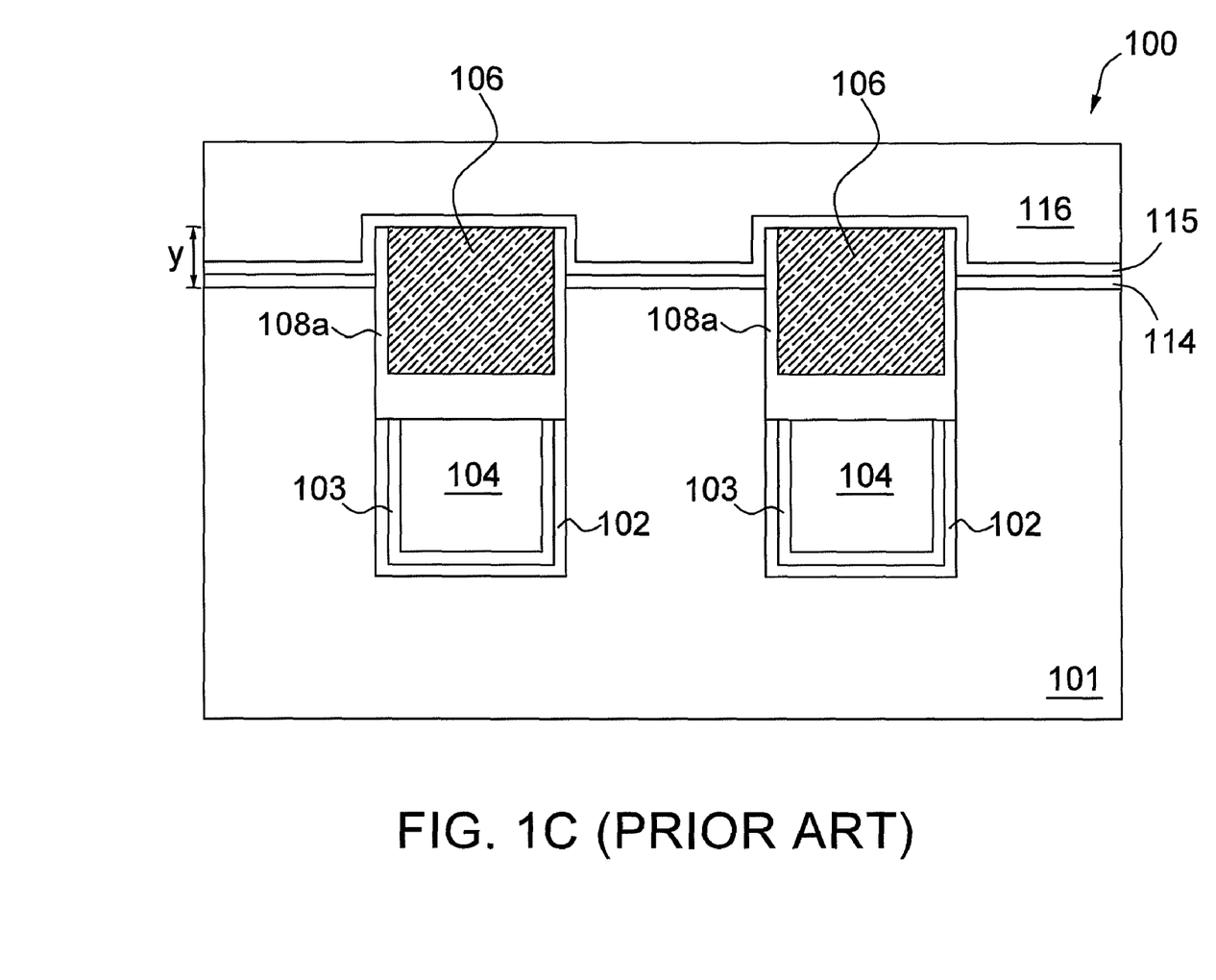
FIG. 1C is a cross-section view taken along the cut line A-A of FIG. 1A after buried word lines are formed.

Since the word line trenches 110 are orthogonal to the bit line trenches 150, the silicon substrate 101 and the oxide layer 106 are alternatingly disposed along the word line trenches 110. Some problems arise during the subsequent etching of the word line trenches 110. First, since silicon and oxide have two different etching rates, etching depths of the silicon substrate 101 and the oxide layer 106 are entirely different, resulting in a rough sidewall and bottom surface along the word line trench 110. FIG. 1C is a cross-section view taken along the cut line A-A of FIG. 1A after buried word lines are formed. Here, gate oxide and a glue layer are designated by 114 and 115, respectively. As can be observed from the bottom of the word line trench 110 in FIGS. 1A and 1C, it is obvious that the etching depth of the silicon substrate 101 is deeper than that of the oxide layer 106, leading to a depth difference y at the bottom of the trench 110. Then, after a metal (not shown) such as Tungsten is filled and then recessed in the word line trench 110, two adjacent word lines 116 in the word line trench 110 are formed by etching away a center region of Tungsten (hereinafter referred to as "WL separating process"). During this WL separating process, in order to clean Tungsten from the bottom of the word line trench 110, the bottom of the word line trench 110 is subject to being over-etched, thereby resulting in a thinner or weaker isolation between the word lines 116 and the bit line 104. On the other hand, it is difficult to clean Tungsten from the bottom of the word line trench 110 and thus residues of Tungsten may cause a short circuit.

Further, the word line trenches 110 also have rough sidewalls for the same reason of different etching rates. More specifically, the oxide sidewalls are more protruding than the silicon sidewalls when the word line trenches 110 are initially formed. Accordingly, after the WL separating process is performed, the thickness of Tungsten along the oxide sidewalls is generally thinner than that along the silicon sidewalls. In general, the thinner the word line (or Tungsten), the more the resistance. The rough sidewalls seriously increase gate resistance. Even though there is a single word line disposed in the trench 116, its rough sidewalls and bottom also lack uniformity in gate resistance.

SUMMARY OF THE INVENTION

In view of the above-mentioned problems, an object of the invention is to provide an integrated circuit with a memory cell, which offers a word line trench having a generally smooth bottom and sidewalls, by way of disposition of a separating layer having an etching rate close to that of its substrate.

According to an embodiment of the invention, an integrated circuit is provided. The integrated circuit includes a vertical transistor, a word line, a bit line and a separating layer. The vertical transistor formed in a substrate includes a channel region arranged between a lower junction region and a upper junction region. The word line is arranged adjacent the channel region in a word line trench. The bit line is disposed below the word line in a bit line trench arranged below the vertical transistor. The separating layer is disposed above the bit line in the bit line trench that separates the word line from the bit line. Here, an etching rate of the separating layer approaches that of the substrate.

According to another embodiment of the invention, an integrated circuit with a memory cell is provided. The integrated circuit with a memory cell includes a word line, a bit line and a separating layer. The word line is disposed in a word line trench of a substrate. The bit line is disposed below the word line in a bit line trench and extending orthogonal to the word line. The separating layer is disposed above the bit line in the bit line trench that separates the word line from the bit line. Here, an etching rate of the separating layer approaches that of the substrate.

According to another embodiment of the invention, a memory device including a plurality of interconnected memory cells is provided. Each of the memory cells includes a word line, a bit line and a separating layer. The word line is disposed in a word line trench of a substrate. The bit line is disposed below the word line in a bit line trench and extends orthogonal to the word line. The separating layer is disposed above the bit line in the bit line trench that separates the word line from the buried bit line. Here, an etching rate of the separating layer approaches that of the substrate.

According to another embodiment of the invention, a method of manufacturing an integrated circuit with a memory cell is provided. The method comprises the following steps. At first, a bit line in a bit line trench of a substrate is formed. Then, a separating layer above the bit line in the bit line trench is formed. Next, a word line trench above and extending orthogonal to the bit line in the substrate is formed. Finally, a word line in the word line trench is formed. Here, the separating layer separates the word line from the bit line and an etching rate of the separating layer approaches that of the substrate.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 2A:
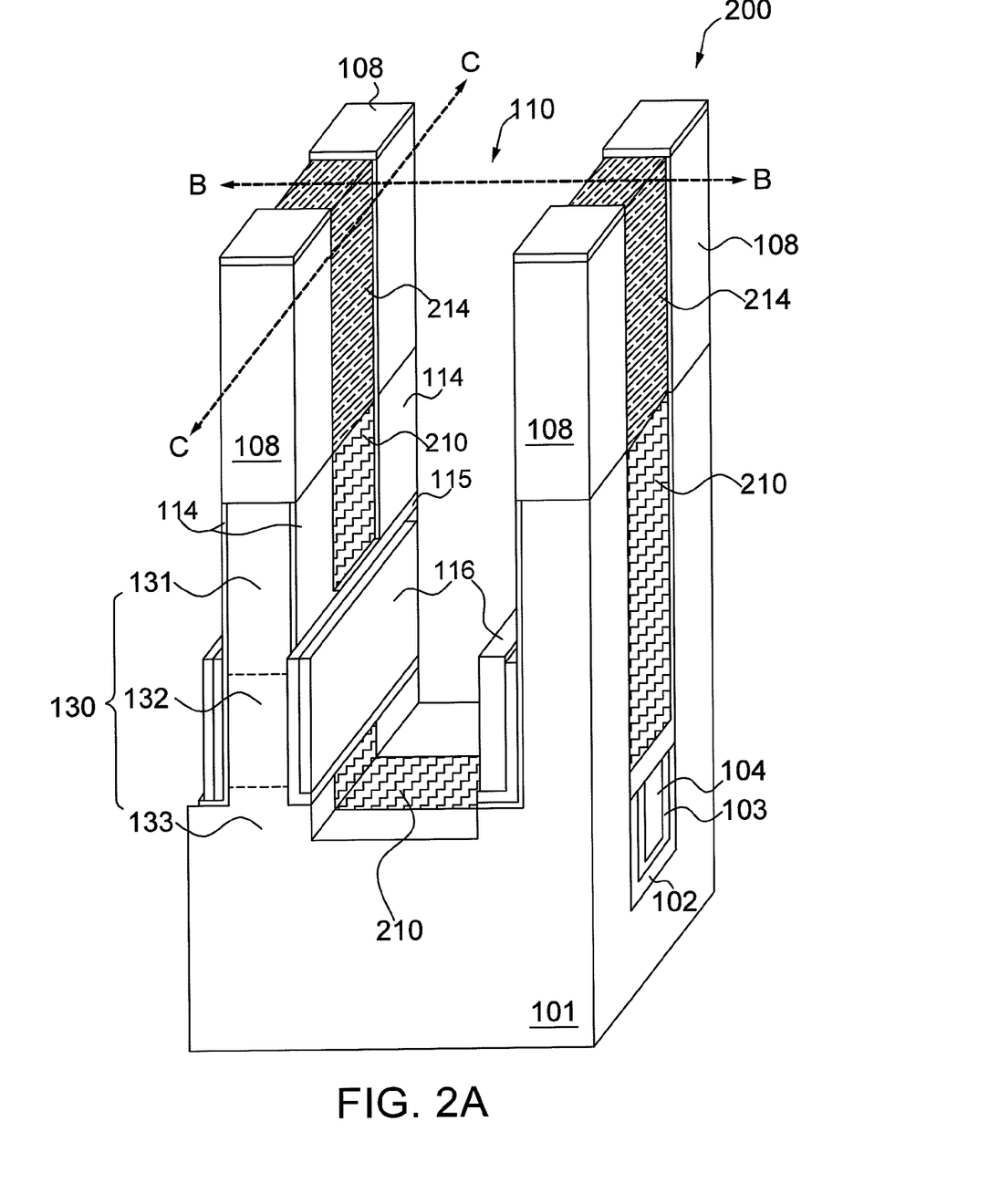
FIG. 2A is a perspective view of a memory cell having a generally smooth word line trench according to an embodiment of the invention.

FIG. 2A is a perspective view of a memory cell having a generally smooth word line trench according to an embodiment of the invention. Referring to FIG. 2A, a memory cell 200 includes buried bit and word lines 104, 116 coupled to a vertical access transistor 130 disposed in a semiconductor substrate 101. The memory cell 200 can be any type of memory cell employing buried bit and word lines 104, 116, such as a DRAM cell, a MRAM cell, a FLASH cell, etc. For ease of description, the memory cell 200 is described herein as a DRAM cell. However, those skilled in the art will appreciate that the embodiments described herein are readily applicable to other types of memory cells having buried bit and word lines 104, 116.

In this specification, common reference numerals have been employed where common elements have the same function as in all drawings and embodiments described herein.

Figure 2B:
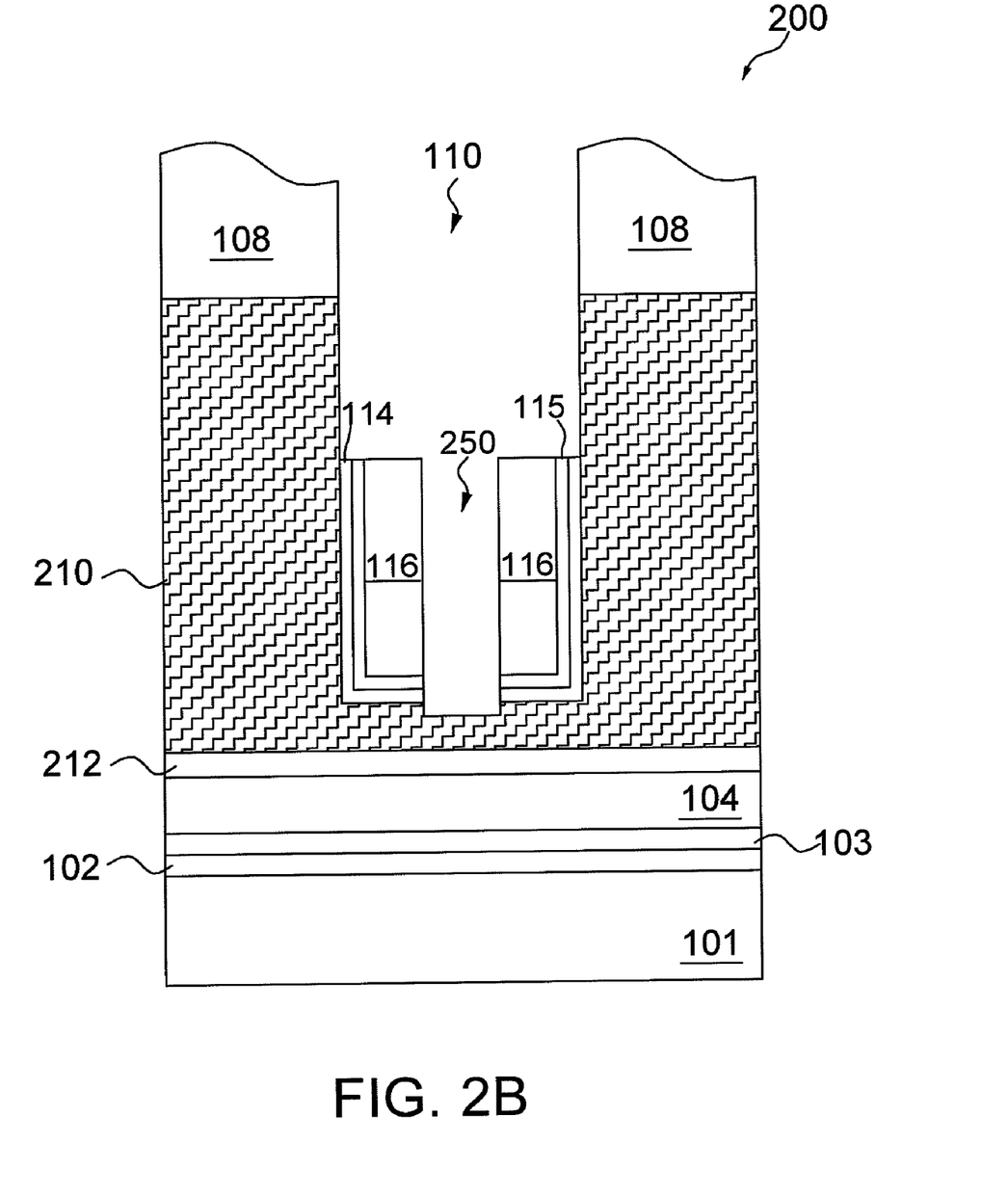
FIG. 2B is a cross-section view taken along the cut line B-B of FIG. 2A.
Figure 5:
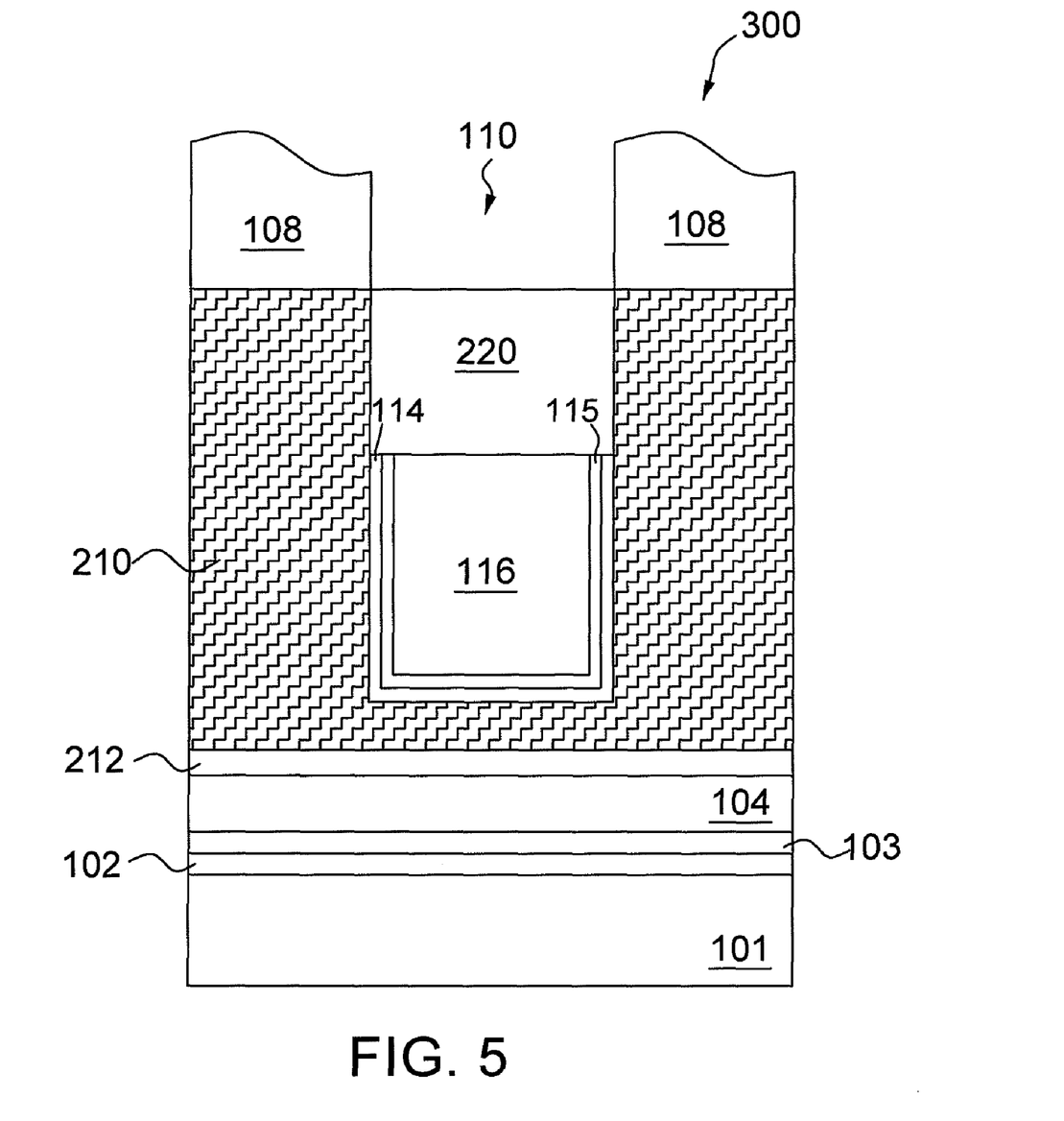
FIG. 5 is a cross-section view of a memory cell having a generally smooth word line trench according to another embodiment of the invention.

FIG. 2B is a cross-section view taken along the cut line B-B of FIG. 2A. Two adjacent word lines 116 are arranged in the same trench 110. A space 250 is not provided when a single word line 116 is disposed in the trench 110 (as shown in FIG. 5). As can be seen from FIGS. 2A and 2B, each word line 116 is horizontally separated from the channel region 132 of a vertical access transistor 130 by gate oxide 114 and a glue layer 115.

Figure 4A:
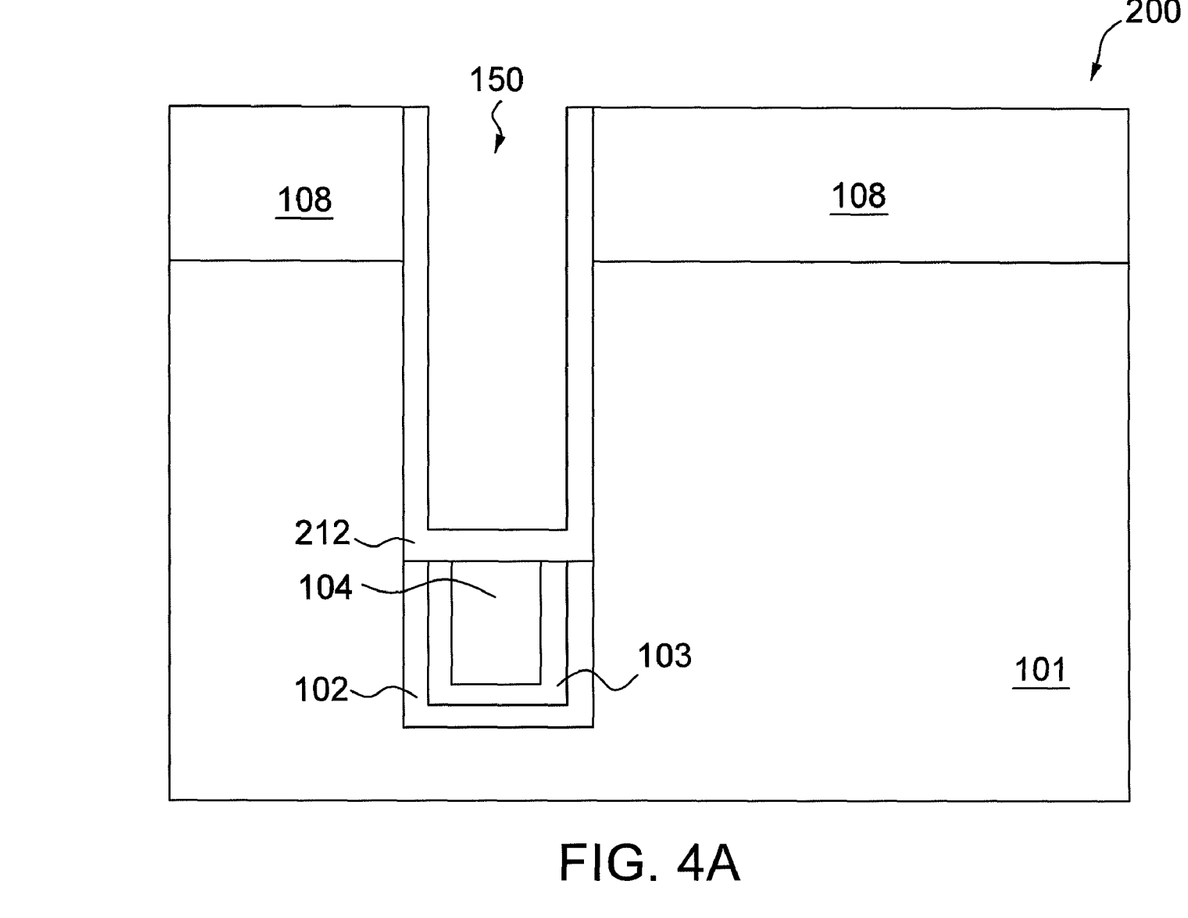
FIGS. 4A-4G are cross-sectional views of a semiconductor substrate during different stages of the manufacturing embodiment illustrated in FIG. 3.

The bit line 104 is arranged below the word line 116 in a bit line trench 150 (not shown) formed in the semiconductor substrate 101 as shown in FIG. 2B. The bit line 104 is vertically separated from the overlying word lines 116 by gate oxide 114, a glue layer 115, a separating layer 210 and an oxide liner 212. The silicon substrate 101 and the separating layer 210 are alternatingly disposed along the word line trenches 110 as shown in FIGS. 2A and 4D. In this embodiment, the substrate 101 is a silicon substrate. According to the invention, the separating layer 210 may be any material having an etching rate close to the substrate 101, such as doped polysilicon, non-doped polysilicon, doped amorphous silicon, non-doped amorphous silicon, etc. Since the silicon substrate 101 and the separating layer 210 have similar etching rates, etching depths of the silicon substrate 101 and the separating layer 210 are substantially equal after the word line trenches 110 are initially formed. As illustrated in FIG. 2B, it is obvious that the sidewalls and the bottom of the word line trench 110 are quite smooth. It is noted that a recess in the separating layer 210 between two adjacent word lines 116 is formed by a subsequent WL separating process. Compared with prior art, the sidewall roughness and bottom roughness along the word line trench 110 are significantly improved and those conventional problems that arise because of different etching rates can be avoided.

Figure 3:
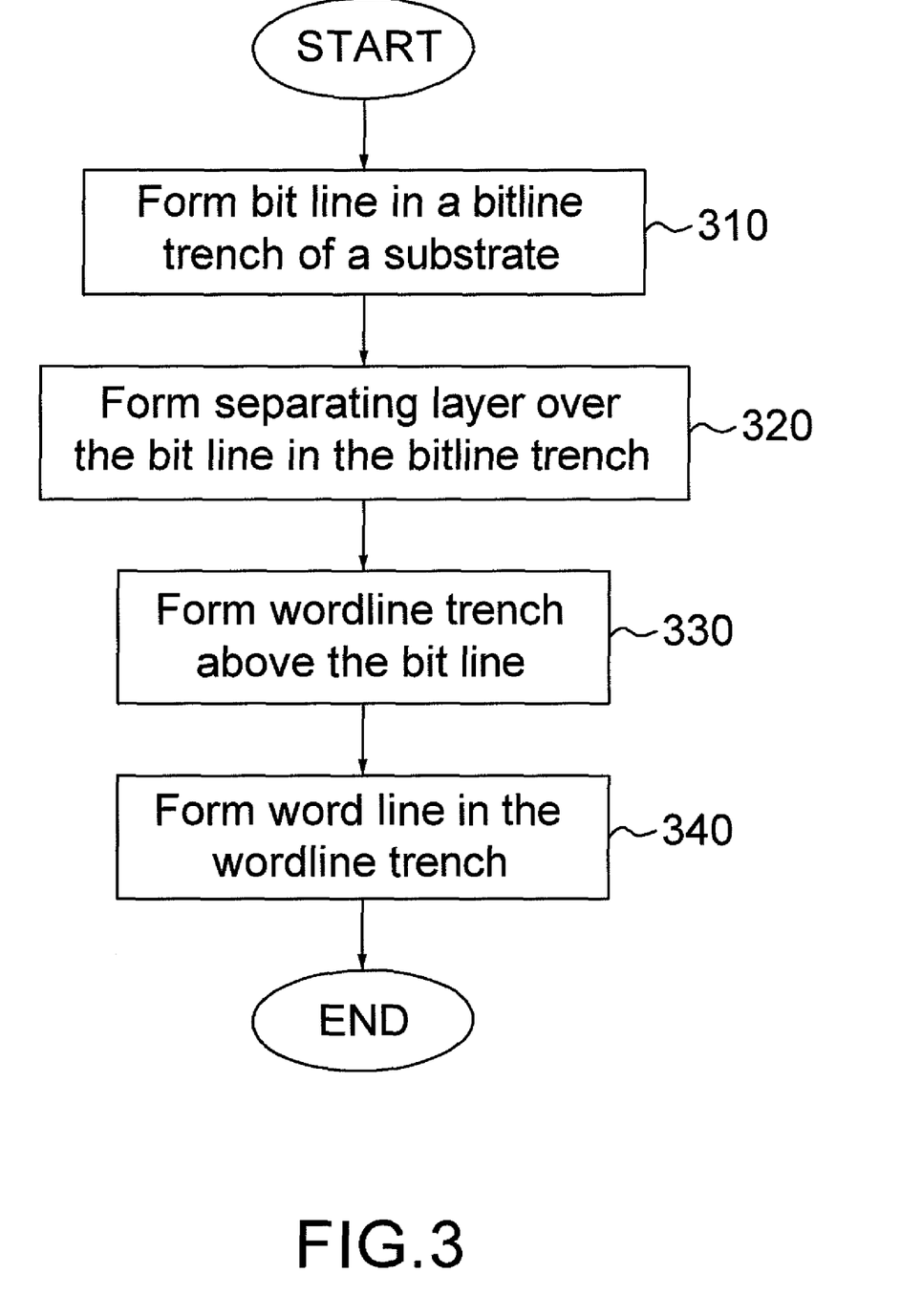
FIG. 3 is a flow chart illustrating a method for manufacturing a memory cell of FIG. 2A according to an embodiment of the invention.

FIG. 3 is a flow chart illustrating a method for manufacturing a memory cell of FIG. 2A according to an embodiment of the invention. The steps of FIG. 3 are illustrated in FIGS. 4A-4G. The embodiment begins with forming the bit line 104 in the bit line trench 150 of the semiconductor substrate 101 (step 310). According to one embodiment, the substrate 101 covered with a nitride layer 108 is etched off to a preset depth, which forms the bit line trenches 150. Referring to FIG. 4A, an oxide liner 102 is formed on the bottom and a portion of sidewalls of the bit line trenches 150 and a glue layer 103 is then formed over the oxide liner 102. Next, a conductive material such as Tungsten is deposited over the glue layer 103 and then recessed back to form the bit line 104. An insulating liner 212 such as oxide liner is deposited on the bit line 104 and the sidewalls of the bit line trench 150. Alternatively, the bit line 104 is formed by fabricating a polysilicon region in the substrate 101.

Figure 4B:
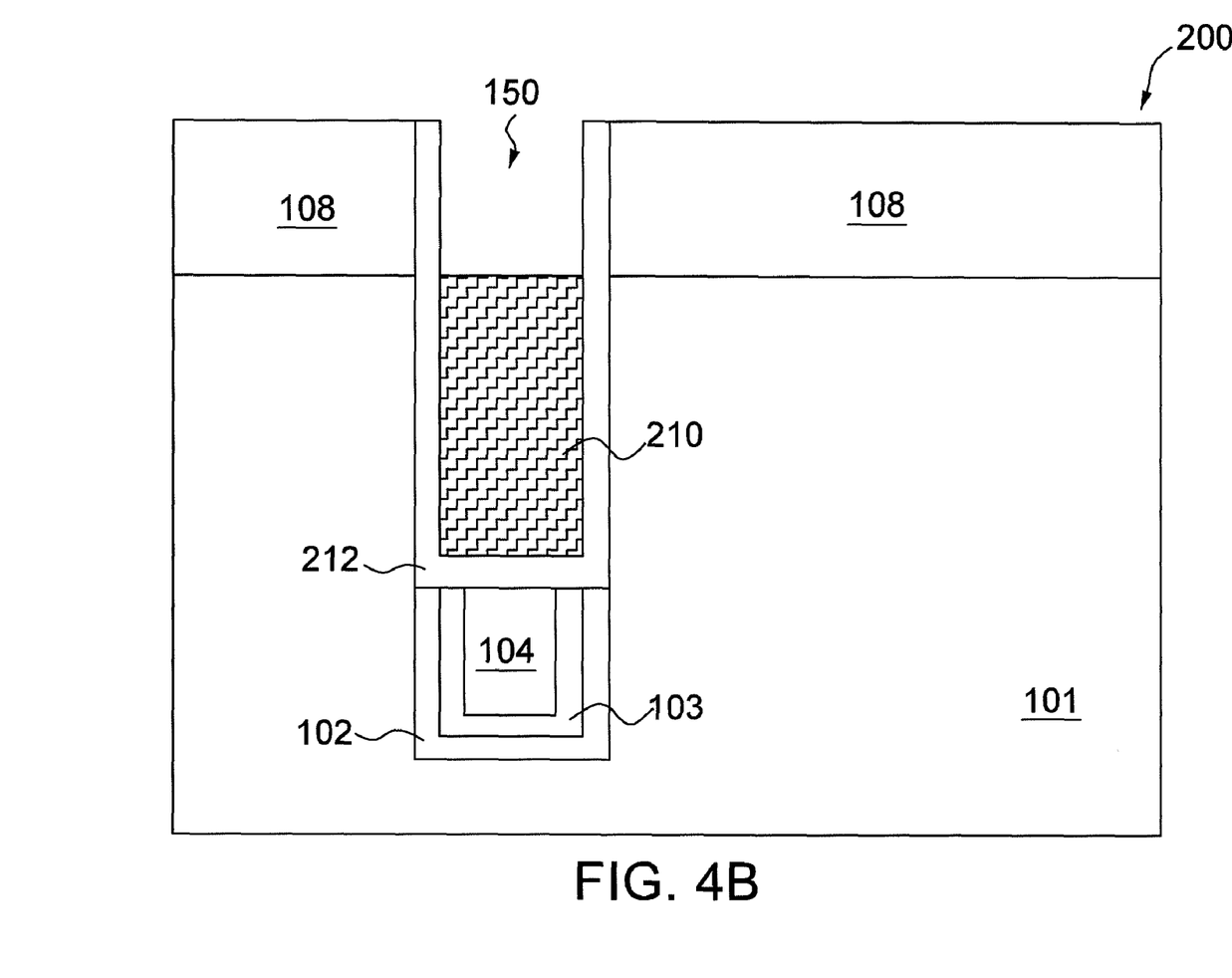
Figure 4C:
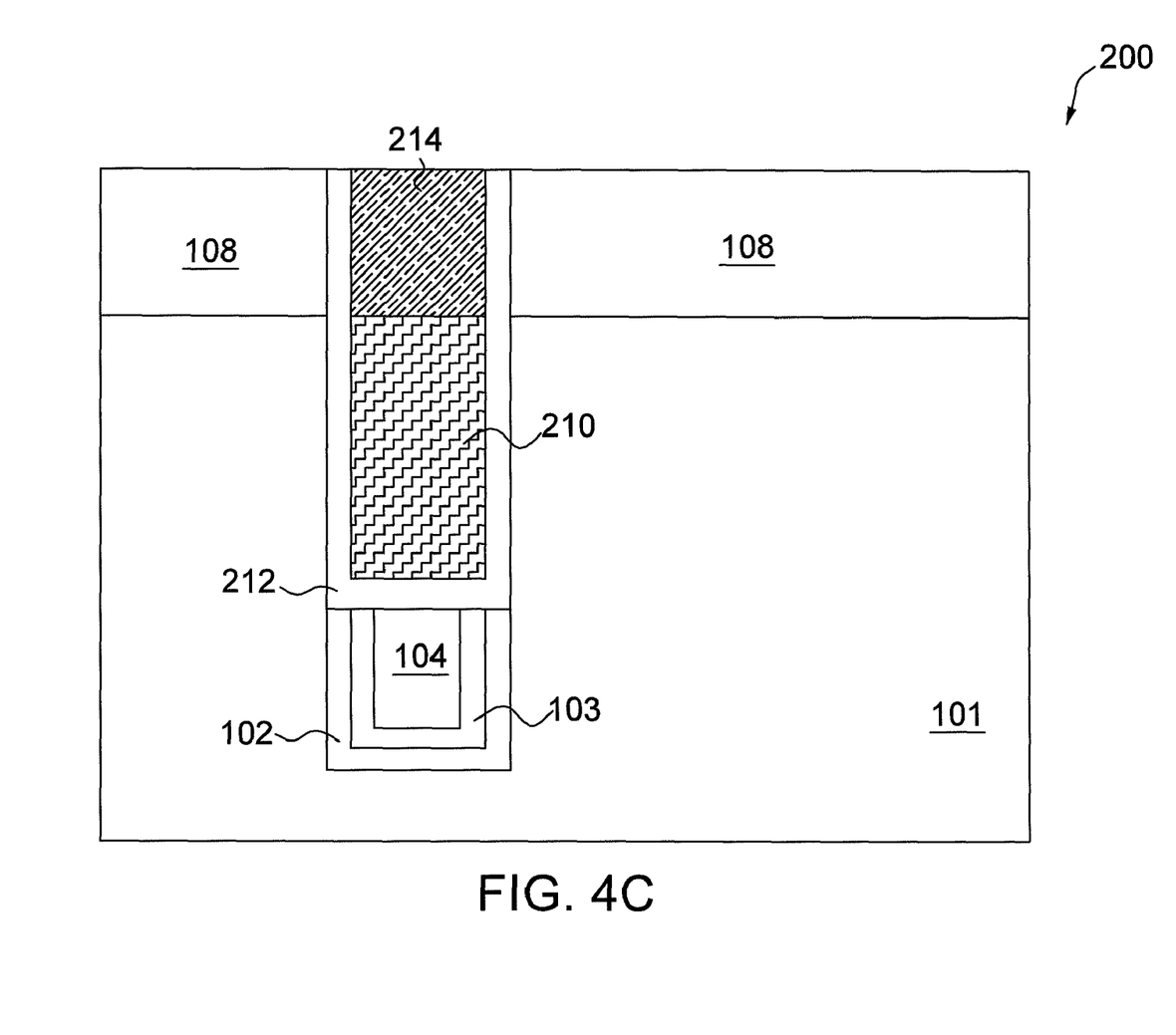
Figure 4D:
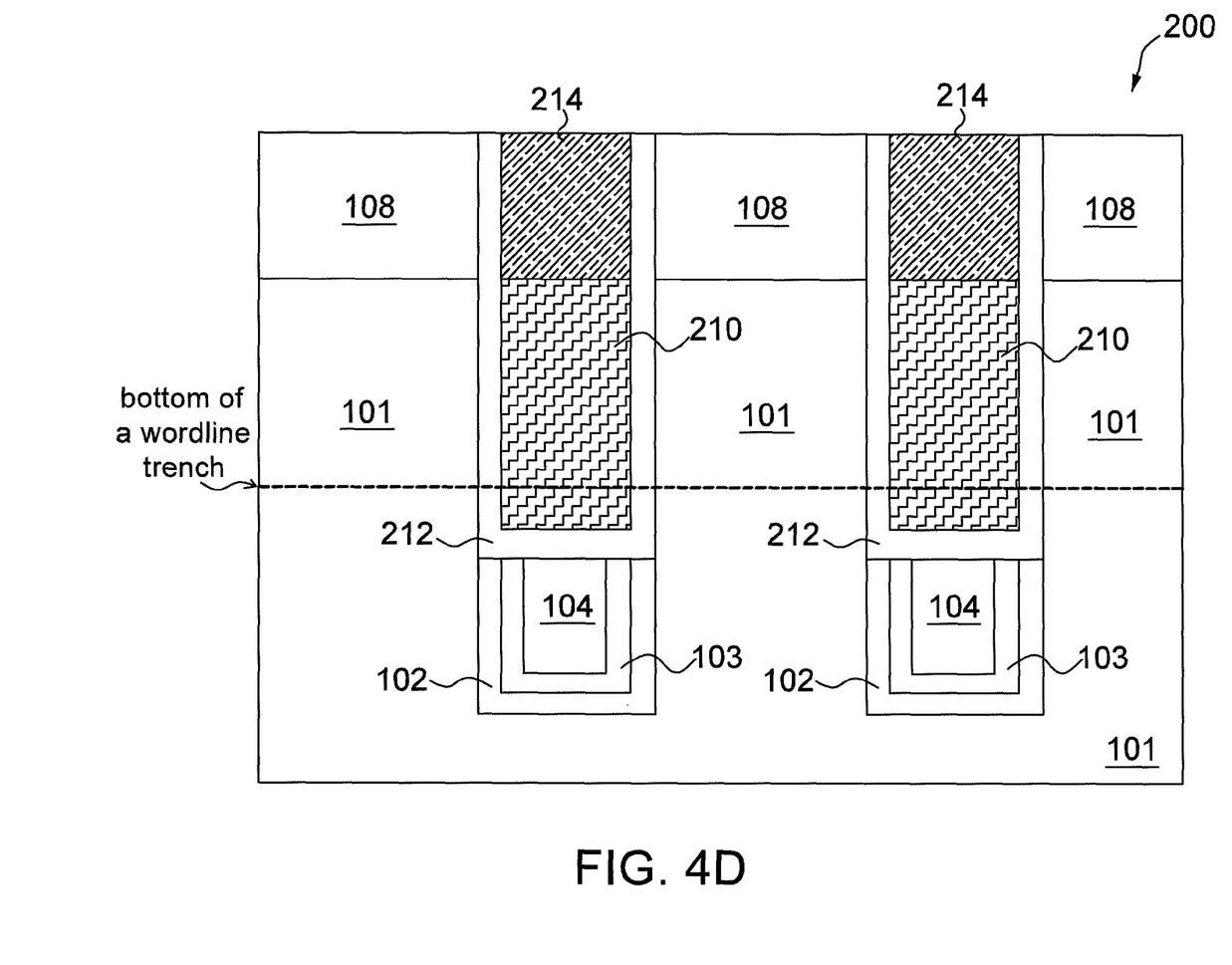

Referring to FIG. 4B, in step 320, the bit line trench 150 is filled with a separating material. Then, CMP or other suitable planarization technique is used to remove portions of the separating material above the surface of the nitride layer 108. The separating material is then etched back to a level that is equal to or below the interface between the nitride layer 108 and the substrate 101, thereby forming the separating layer 210. Certainly, the top of the separating layer 210 needs to be higher than that of the subsequent word line 116 to ensure generally smooth sidewalls of the word line trench 110. The separating material has an etching rate close to the substrate 101. According to one embodiment, the substrate 101 is a silicon substrate and the separating material is non-monolithic silicon, such as doped polysilicon, non-doped polysilicon, doped amorphous silicon, non-doped amorphous silicon, etc. Isolation material 214, such as $SiO_2$, is deposited to fill the bit line trench 150 and the working surface is then planarized, such as by CMP, as shown in FIG. 4C.

Figure 4E:
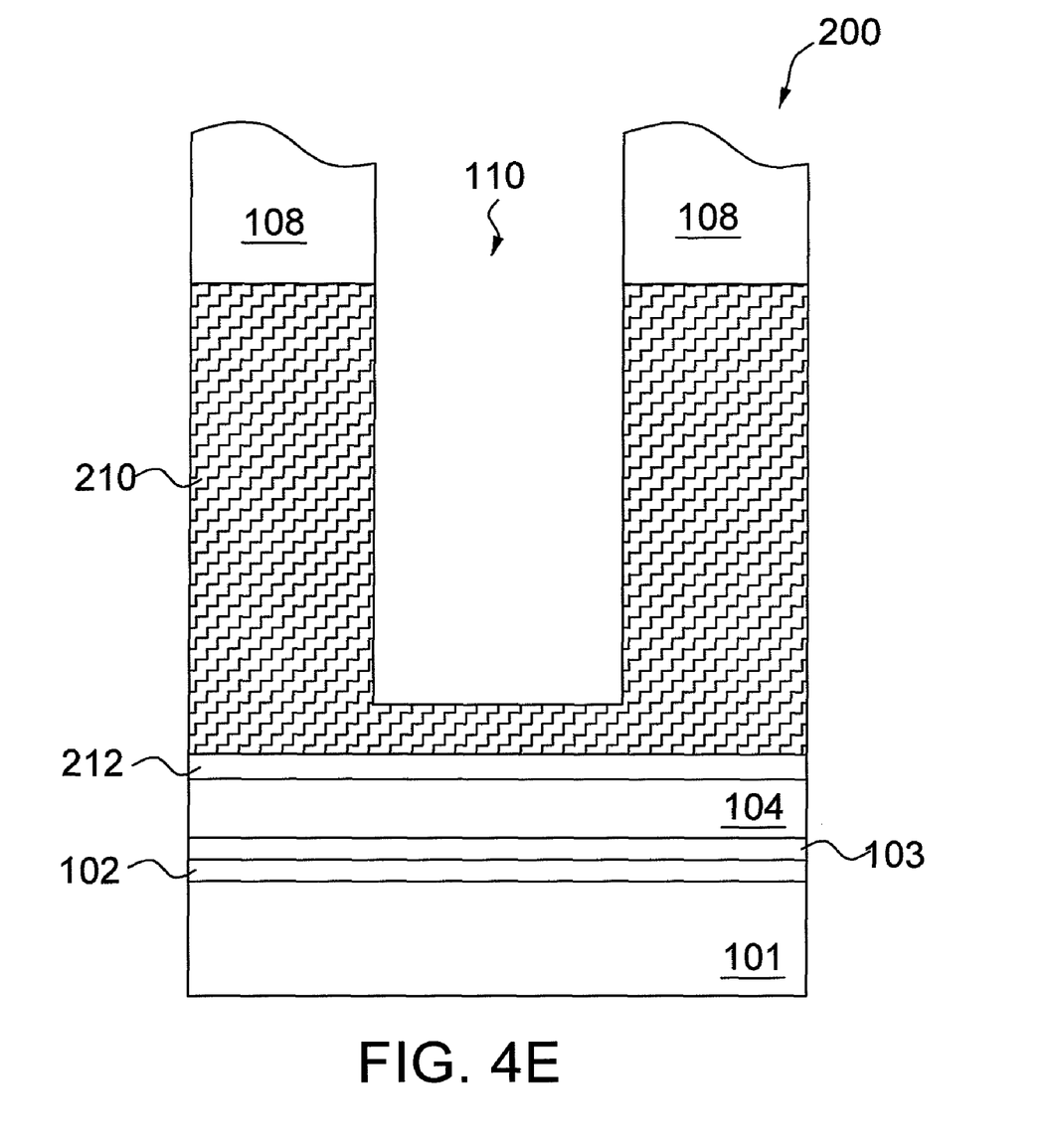

FIG. 4D is a cross-section view taken along the cut line C-C of FIG. 2A after the word line trenches are initially formed. FIG. 4E is a cross-section view taken along the cut line B-B of FIG. 2A after the word line trenches are initially formed.

Afterward, a word line trench 110 is formed in the substrate 101 above and orthogonal to the bit line 104 (step 330). It is obvious that the silicon substrate 101 and the separating layer 210 are alternatingly disposed along the word line trenches 110 as shown in FIG. 4D. Since the substrate 101 and the separating layer 210 have similar or close etching rates, their etching depths are also close to each other. As can be observed from FIGS. 4D and 4E, the sidewalls and the bottom of the word line trench 110 in of the memory cell 200 are relatively smooth compared with those of the memory cell 100 in FIG. 1C. This greatly helps gate resistance uniformity in the subsequent deposition of the word line 116.

Figure 4F:
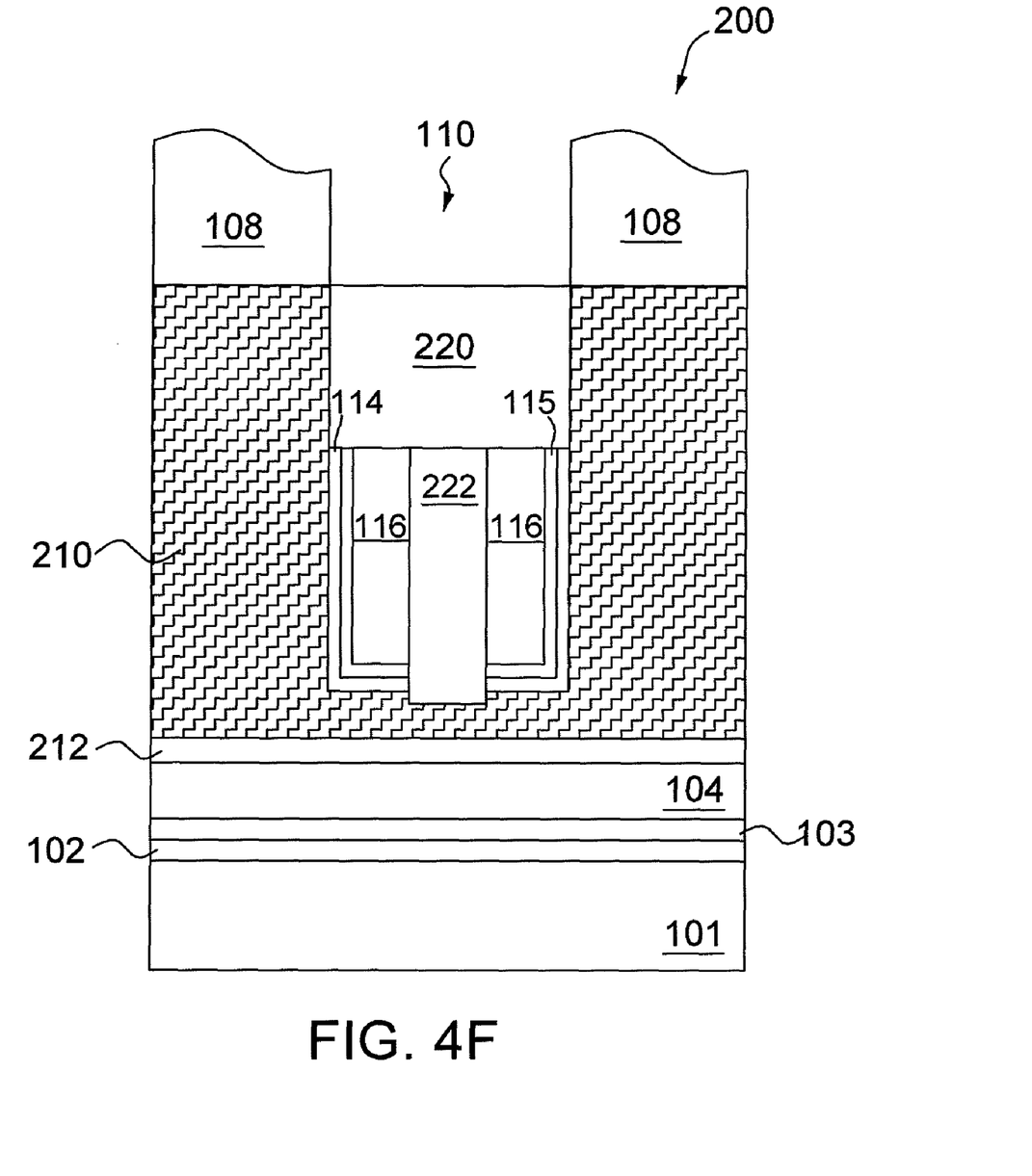
Figure 4G:
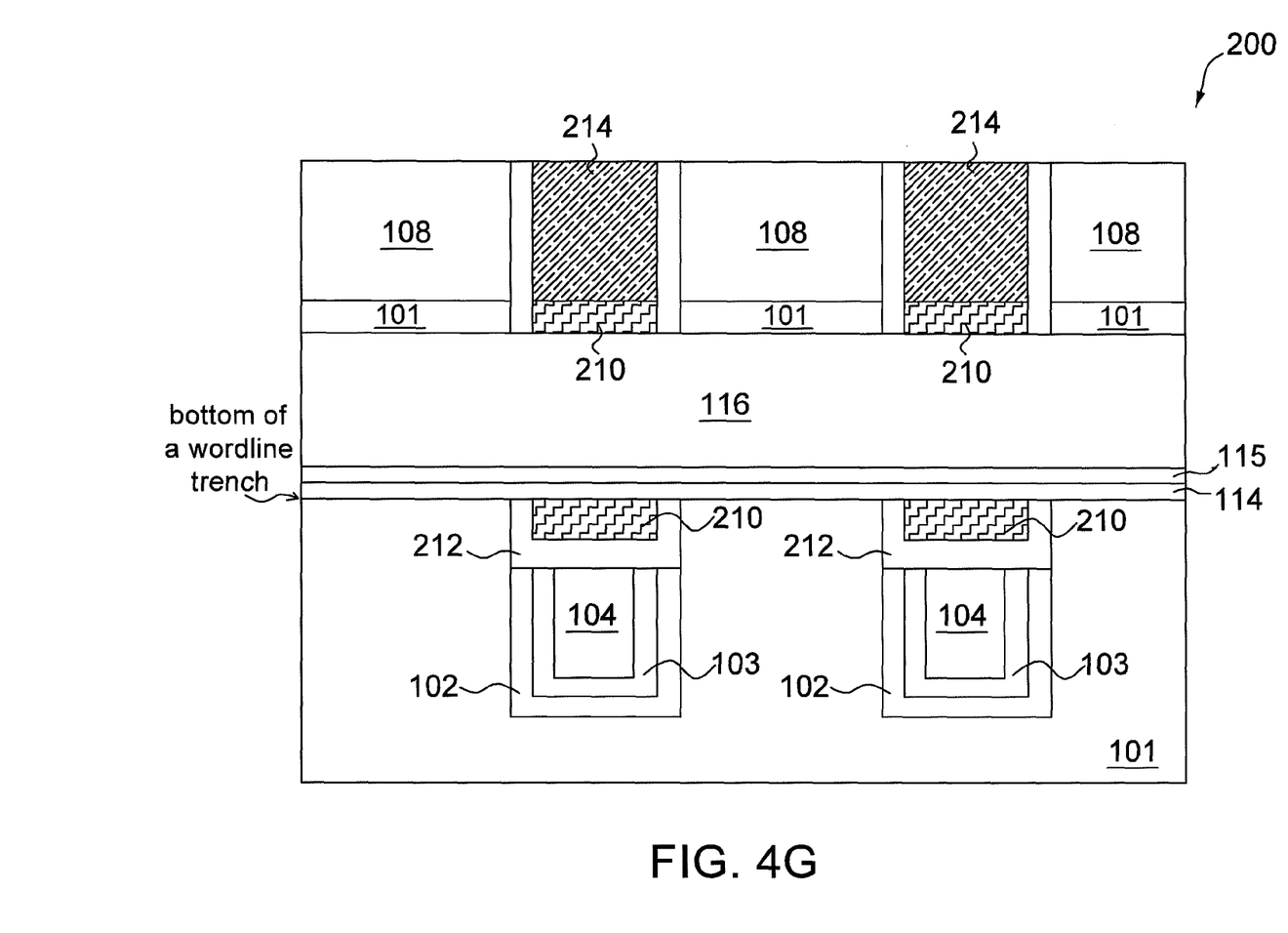

Next, the word line 116 is formed in the word line trench 110 (step 340). According to one embodiment, gate oxide 114 is first formed on the sidewalls and a bottom of the word line trench 110 and a glue layer 115 is formed over the gate oxide 114 as illustrated in FIGS. 4F and 4G. A conductive material such as Tungsten is deposited over the glue layer 115 and then recessed back to form the word line 116. According to the embodiment of FIG. 2A, a center region of Tungsten in the word line trench 110 is etched off and particularly into the separating layer 210 to form a recess in the separating layer 210. Then the resulting space is filled with isolation material 222 such as oxide or nitride to isolate adjacent word lines 116. Finally, the top insulating layer 220 is formed over the word lines 116 and the working surface is planarized, such as by CMP.

In an alternative embodiment, a single word line 116 is disposed in the word line trench 110 and the top insulating layer 220 is formed over the word lines 116 of a memory cell 300 as shown in FIG. 5.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An integrated circuit, comprising:
   a vertical transistor formed in a substrate, the vertical transistor comprising a channel region arranged between a lower junction region and a upper junction region;
   a word line arranged adjacent the channel region in a word line trench;
   a bit line disposed below the word line in a bit line trench arranged below the vertical transistor; and
   a separating layer disposed above the bit line in the bit line trench that separates the word line from the bit line;
   wherein an etching rate of the separating layer approaches that of the substrate.

2. The circuit according to claim 1, further comprising:
   an insulating layer interposed between the separating layer and the bit line in the bit line trench.

3. The circuit according to claim 1, wherein sidewalls and a bottom of the word line trench are substantially smooth.

4. The circuit according to claim 1, wherein, when the substrate is made of silicon, the separating layer is selected from the group consisting of doped polysilicon, non-doped polysilicon, doped amorphous silicon and non-doped amorphous silicon.

5. The circuit according to claim 1, wherein the word line is a common word line that is shared by all the memory cells that are located along both sides of the word line trench.

6. The circuit according to claim 1, wherein a top of the separating layer is below a top of the substrate.

7. The circuit according to claim 1, wherein a top of the separating layer is above a top of the word line.

8. An integrated circuit with a memory cell, comprising:
   a word line disposed in a word line trench of a substrate;
   a bit line disposed below the word line in a bit line trench and extending orthogonal to the word line; and
   a separating layer disposed above the bit line in the bit line trench that separates the word line from the bit line;
   wherein an etching rate of the separating layer approaches that of the substrate.

9. The circuit according to claim 8, further comprising:
   an insulating layer interposed between the separating layer and the bit line in the bit line trench.

10. The circuit according to claim 8, wherein sidewalls and a bottom of the word line trench are substantially smooth.

11. The circuit according to claim 8, wherein, when the substrate is made of silicon, the separating layer is selected from the group consisting of doped polysilicon, non-doped polysilicon, doped amorphous silicon and non-doped amorphous silicon.

12. The circuit according to claim 8, wherein the word line is a common word line that is shared by all the memory cells that are located along both sides of the word line trench.

13. The circuit according to claim 8, wherein a height of the separating layer is below a top of the substrate.

14. The circuit according to claim 8, wherein a top of the separating layer is above a top of the word line.

15. A memory device comprising a plurality of interconnected memory cells, each of the memory cells comprising:
    a word line disposed in a word line trench of a substrate;
    a bit line disposed below the word line in a bit line trench and extending orthogonal to the word line; and
    a separating layer disposed above the bit line in the bit line trench that separates the word line from the buried bit line;
    wherein an etching rate of the separating layer approaches that of the substrate.

16. The circuit according to claim 15, wherein the word line is a common word line that is shared by all the memory cells that are located along both sides of the word line trench.

17. The circuit according to claim 15, further comprising:
    an insulating layer interposed between the separating layer and the bit line in the bit line trench.

18. The circuit according to claim 15, wherein sidewalls and a bottom of the word line trench are substantially smooth.

19. The circuit according to claim 15, wherein, when the substrate is made of silicon, the separating layer is selected from the group consisting of doped polysilicon, non-doped polysilicon, doped amorphous silicon and non-doped amorphous silicon.

20. The circuit according to claim 15, wherein a top of the separating layer is below a top of the substrate.

21. The circuit according to claim 15, wherein a top of the separating layer is above a top of the word line.

22. A method of manufacturing an integrated circuit with a memory cell, comprising:
    forming a bit line in a bit line trench of a substrate;
    forming a separating layer above the bit line in the bit line trench;
    forming a word line trench above and extending orthogonal to the bit line in the substrate; and
    forming a word line in the word line trench;
    wherein the separating layer separates the word line from the bit line and an etching rate of the separating layer approaches that of the substrate.

23. The method according to claim 22, wherein the word line is a common word line that is shared by all the memory cells that are located along both sides of the word line trench.

24. The method according to claim 22, further comprising:
   removing a center region of the word line to split the word line into two halves.

25. The method according to claim 22, wherein sidewalls and a bottom of the word line trench are substantially smooth.

26. The method according to claim 22, wherein, when the substrate is made of silicon, the separating layer is selected from the group consisting of doped polysilicon, non-doped polysilicon, doped amorphous silicon and non-doped amorphous silicon.

27. The method according to claim 22, wherein the step of forming a separating layer comprises:
   forming an insulating liner on sidewalls and a top of the bit line trench; and
   forming the separating layer over the insulating liner below a top of the substrate.

28. The method according to claim 22, wherein a top of the separating layer is below a top of the substrate.

29. The method according to claim 22, wherein a top of the separating layer is above a top of the word line.

* * * * *